(12) United States Patent
Denison et al.

(10) Patent No.: US 9,136,368 B2
(45) Date of Patent: Sep. 15, 2015

(54) TRENCH GATE TRENCH FIELD PLATE SEMI-VERTICAL SEMI-LATERAL MOSFET

(71) Applicant: Texas Instruments Incorporated, Dallas, TX (US)

(72) Inventors: Marie Denison, Plano, TX (US); Sameer Pendharkar, Allen, TX (US); Guru Mathur, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/044,909

(22) Filed: Oct. 3, 2013

(65) Prior Publication Data

US 2015/0097225 A1    Apr. 9, 2015

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/78 | (2006.01) |
| H01L 29/66 | (2006.01) |
| H01L 29/10 | (2006.01) |
| H01L 29/08 | (2006.01) |

(52) U.S. Cl.
CPC ........ *H01L 29/7801* (2013.01); *H01L 29/0882* (2013.01); *H01L 29/1095* (2013.01); *H01L 29/66674* (2013.01)

(58) Field of Classification Search
CPC ..... H01L 29/76; H01L 31/062; H01L 31/113; H01L 31/119; H01L 29/7813; H01L 29/7802; H01L 29/7827; H01L 29/66666
USPC .......................... 257/262, 329, 330; 438/589
See application file for complete search history.

(56) References Cited

U.S. PATENT DOCUMENTS

| | | | |
|---|---|---|---|
| 2012/0146133 A1* | 6/2012 | Hirler et al. | 257/330 |
| 2013/0307062 A1* | 11/2013 | Meiser et al. | 257/330 |
| 2014/0077342 A1* | 3/2014 | He et al. | 257/629 |
| 2014/0124855 A1* | 5/2014 | Hebert | 257/334 |

* cited by examiner

*Primary Examiner* — Phuc Dang
(74) *Attorney, Agent, or Firm* — Jacqueline J. Garner; Frank D. Cimino

(57) ABSTRACT

A semiconductor device has a vertical drain extended MOS transistor with deep trench structures to define a vertical drift region and at least one vertical drain contact region, separated from the vertical drift region by at least one instance of the deep trench structures. Dopants are implanted into the vertical drain contact regions and the semiconductor device is annealed so that the implanted dopants diffuse proximate to a bottom of the deep trench structures. The vertical drain contact regions make electrical contact to the proximate vertical drift region at the bottom of the intervening deep trench structure. At least one gate, body region and source region are formed above the drift region at, or proximate to, a top surface of a substrate of the semiconductor device. The deep trench structures are spaced so as to form RESURF regions for the drift region.

11 Claims, 12 Drawing Sheets

TRENCH GATE TRENCH FIELD PLATE SEMI-VERTICAL SEMI-LATERAL MOSFET

FIELD OF THE INVENTION

This invention relates to the field of semiconductor devices. More particularly, this invention relates to drain extended transistors in semiconductor devices.

BACKGROUND OF THE INVENTION

An extended drain metal oxide semiconductor (MOS) transistor may be characterized by the resistance of the transistor in the on state, the lateral area which the transistor occupies at the top surface of the substrate containing the transistor, and the breakdown potential between the drain node and the source node of the transistor which limits the maximum operating potential of the transistor. It may be desirable to reduce the area of the transistor for given values of the on-state resistance and the breakdown potential. One technique to reduce the area is to configure the drift region in the extended drain in a vertical orientation, so that drain current in the drift region flows perpendicularly to the top surface of the substrate. Integrating a vertically oriented drift region in a semiconductor device using planar processing while limiting fabrication cost and complexity to desired levels may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device having a vertical drain extended MOS transistor may be formed by forming deep trench structures to define a vertical drift region of the transistor and to define at least one vertical drain contact region proximate to the drift region, separated from the vertical drift region by at least one instance of the deep trench structures. Dopants are implanted into the vertical drain contact regions and the semiconductor device is annealed so that the implanted dopants diffuse proximate to a bottom of the deep trench structures. The vertical drain contact regions make electrical contact to the proximate vertical drift region at the bottom of the intervening deep trench structure. At least one gate, body region and source region are formed above the drift region at, or proximate to, a top surface of a substrate of the semiconductor device. The deep trench structures are spaced so as to form RESURF regions for the drift region.

DETAILED DESCRIPTION OF EXAMPLE EMBODIMENTS

Figure 1:
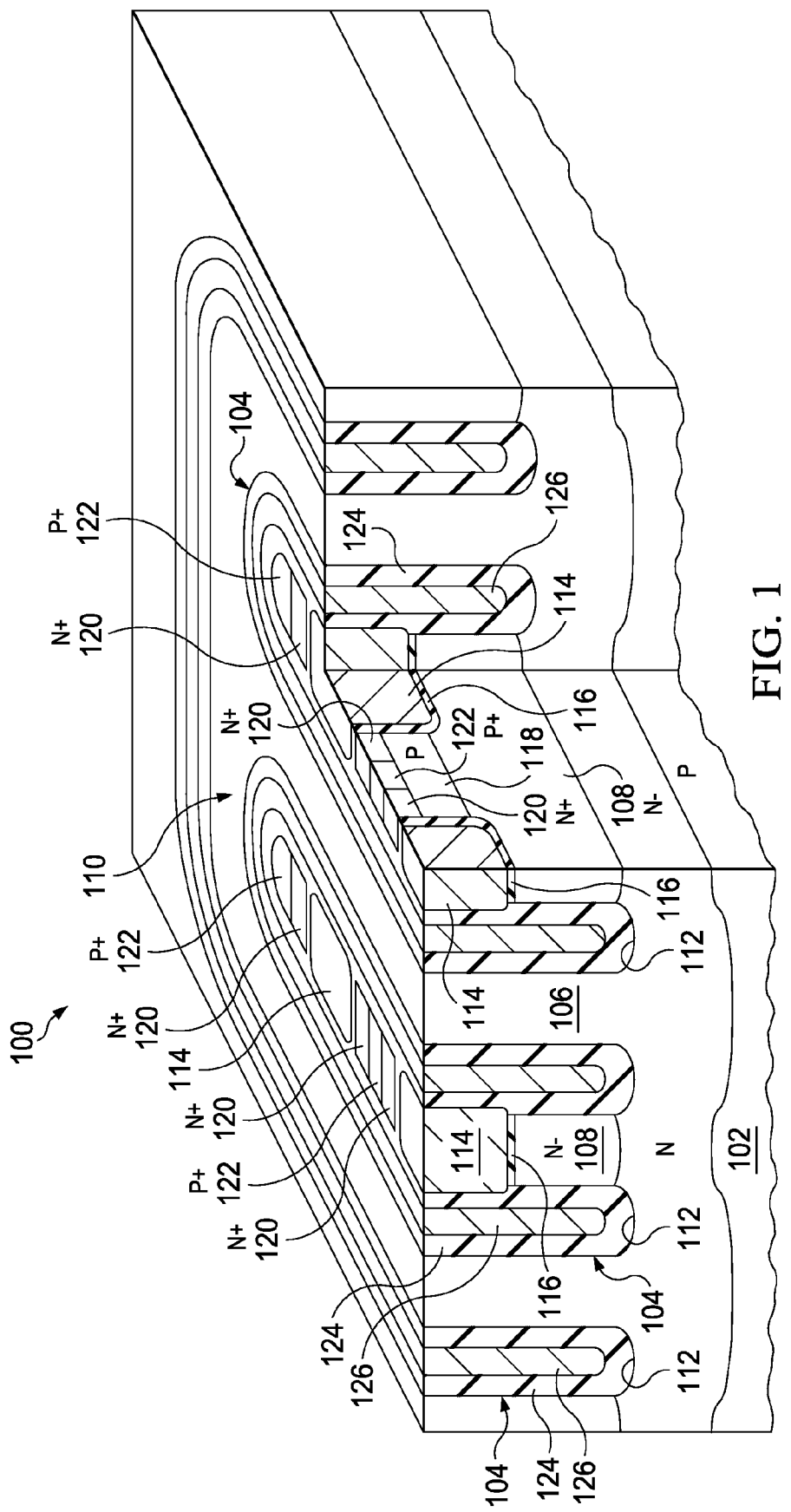
FIG. 1 is a cross section of a semiconductor device having a vertical drain extended MOS transistor.

The following co-pending patent applications contain related matter and are incorporated by reference: U.S. patent application Ser. No. 14/044,915, filed simultaneously with this application) entitled "TRENCH GATE TRENCH FIELD PLATE VERTICAL MOSFET;" and U.S. patent application Ser. No. 14/044,926, filed simultaneously with this application) entitled "VERTICAL TRENCH MOSFET DEVICE IN INTEGRATED POWER TECHNOLOGIES."

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device having a vertical drain extended MOS transistor may be formed by forming deep trench structures to define a vertical drift region of the transistor and to define at least one vertical drain contact region proximate to the drift region, separated from the vertical drift region by at least one instance of the deep trench structures. Dopants are implanted into the vertical drain contact regions and the semiconductor device is annealed so that the implanted dopants diffuse proximate to a bottom of the deep trench structures. The vertical drain contact regions make electrical contact to the proximate vertical drift region at the bottom of the intervening deep trench structure. At least one gate, body region and source region are formed above the drift region at, or proximate to, a top surface of a substrate of the semiconductor device. The deep trench structures are spaced so as to form RESURF regions for the drift region. The semiconductor device may be, in one example, an integrated circuit containing the vertical drain extended MOS transistor and at least one other transistor. The semiconductor device may be, in another example, a discrete device in which the vertical drain extended MOS transistor is the only transistor.

For the purposes of this description, the term "specific resistivity" with respect to a transistor will be understood to mean a product of an area the transistor occupies at a top surface of a substrate in which the transistor is formed times a resistance of the transistor when the transistor is fully turned on.

For the purposes of this description, the term "RESURF" will be understood to refer to a material which reduces an electric field in an adjacent semiconductor region. A RESURF region may be for example a semiconductor region with an opposite conductivity type from the adjacent semiconductor region. RESURF structures are described in Appels, et al., "Thin Layer High Voltage Devices" Philips J, Res. 35 1-13, 1980.

The examples described in this disclosure describe n-channel devices. It will be recognized that corresponding p-channel devices may be formed by appropriate changes in doping polarities. FIG. 1 is a cross section of a semiconductor device having a vertical drain extended MOS transistor. The semiconductor device 100 is formed in and on a p-type semiconductor substrate 102. Deep trench structures 104 are disposed in the substrate 102 so as to define at least one n-type vertical drain contact region 106 and at least one n-type vertically oriented drift region 108 of the vertical drain extended MOS transistor 110. The vertical drain contact region 106 is bounded on at least two opposite sides by the deep trench structures 104. The vertical drain contact region 106 is n-type and extends below bottoms 112 of the deep trench structures 104 in the instant example. The vertical drain contact region 106 may extend laterally under the bottoms 112 of the deep trench structures 104 so as to separate the vertically oriented drift region 108 from a p-type bottom region of the substrate 102 as depicted in FIG. 1. In other examples, the vertical drain contact region 106 may have a more limited lateral extent. The vertically oriented drift regions 108 are n-type and make electrical connection to the vertical drain contact region 106 proximate to the bottoms of the deep trench structures 104. Electrical connection to the vertical drain contact region 106 in the instant example is made at a top surface of the substrate 102.

At least one gate 114 and corresponding gate dielectric layer 116 is disposed over the vertically oriented drift regions 108. In the instant example, the gates 114 are disposed in trenches in the substrate 102 and extend between adjacent instances of the deep trench structures 104. At least one p-type body region 118 is disposed in the substrate 102 adjacent to the gates 114 and the vertically oriented drift regions 108. At least one n-type source region 120 is disposed in the substrate adjacent to the gates 114. One or more optional p-type body contact regions 122 may be disposed in the substrate 102 abutting the body regions 118. Electrical connection to the source regions 120 and the body contact regions 122 in the instant example are made at a top surface of the substrate 102. It will be recognized that other configurations of gates may be used in the vertical drain extended MOS transistor 110 with the configuration of deep trench structures 104, vertical drain contact region 106 and vertically oriented drift region 108 depicted in FIG. 1.

The deep trench structures 104 may be 1 to 5 microns deep, and 0.5 to 1.5 microns wide. For example, deep trench structures 104 which are 2.5 microns deep may provide 30 volt operation for the vertical drain extended MOS transistor 110. Deep trench structures 104 which are 4 microns deep may provide 50 volt operation for the vertical drain extended MOS transistor 110. The deep trench structures 104 have dielectric liners 124 and may have optional electrically conductive central members 126. Instances of the deep trench structures 104 abutting the vertically oriented drift regions 108 may be spaced 0.5 to 2 microns apart so as to provide RESURF regions for the vertically oriented drift regions 108. Instances of the deep trench structures 104 abutting the vertical drain contact region 106 may be spaced 0.5 to 2.5 microns apart. During operation of the vertical drain extended MOS transistor 110, the electrically conductive central members 126, if present, may be electrically biased to reduce a peak electric field in the vertically oriented drift regions 108. For example, the electrically conductive central members 126 may be connected to source regions 120, to the gates 114 or to a bias source having a desired potential.

Instances of the vertically oriented drift regions 108 are disposed adjacent to the vertical drain contact region 106. For example, instances of the vertically oriented drift regions 108 may alternate with the vertical drain contact region 106, as depicted in FIG. 1. The deep trench structures 104 may surround the vertically oriented drift regions 108, as depicted in FIG. 1. The vertical drain contact region 106 may be contiguous, as depicted in FIG. 1. Alternate configurations of the deep trench structures 104 are discussed below. Forming the vertical drain extended MOS transistor 110 so that the deep trench structures 104 provide RESURF regions for the vertically oriented drift regions 108 may provide a desired balance between operating voltage and specific resistivity for the vertical drain extended MOS transistor 110. Forming the vertical drain contact region 106 so as to isolate the vertically oriented drift regions 108 from the bottom region of the substrate 102 may desirably reduce a resistance of the vertical drain extended MOS transistor 110.

Figure 2:
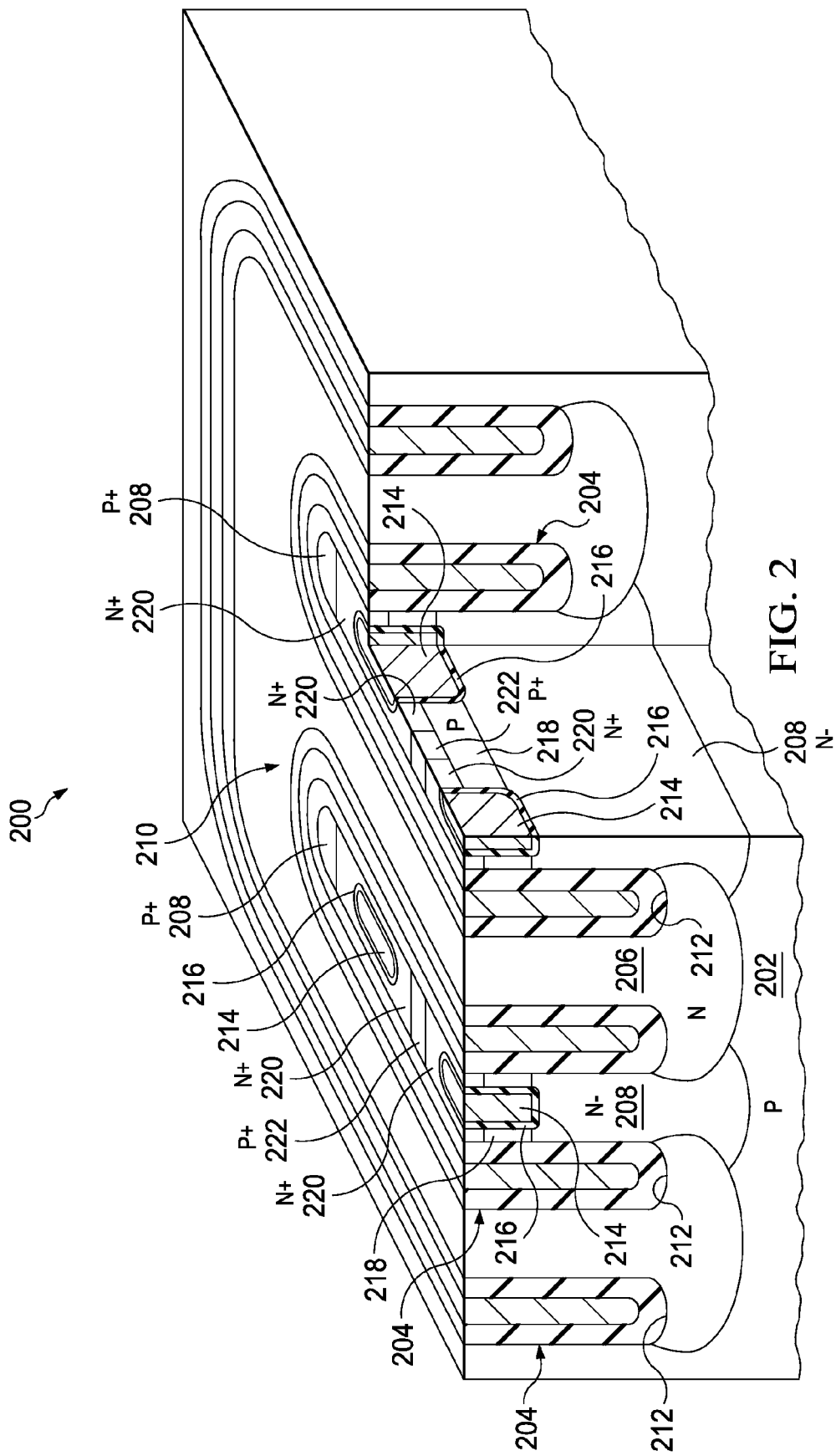
FIG. 2 is a cross section of another semiconductor device having a vertical drain extended MOS transistor.

FIG. 2 is a cross section of another semiconductor device having a vertical drain extended MOS transistor. The semiconductor device 200 is formed in and on a p-type semiconductor substrate 202. Deep trench structures 204, as described in reference to FIG. 1, are disposed in the substrate 202 so as to define at least one n-type vertical drain contact region 206 and at least one n-type vertically oriented drift region 208 of the vertical drain extended MOS transistor 210. The vertical drain contact region 206 is bounded on at least two opposite sides by the deep trench structures 204. The vertical drain contact region 206 is n-type and extends below bottoms 212 of the deep trench structures 204 in the instant example. The vertical drain contact region 206 may extend laterally past the bottoms 212 of the deep trench structures 204 but not enough to isolate the vertically oriented drift region 208 from a bottom region of the substrate 202, as depicted in FIG. 2. In other examples, the vertical drain contact region 206 may have a more limited vertical and/or lateral extent. The vertically oriented drift regions 208 are n-type and make electrical connection to the vertical drain contact region 206 proximate to the bottoms of the deep trench structures 204. Electrical connection to the vertical drain contact region 206 in the instant example is made at a top surface of the substrate 202.

At least one gate 214 and corresponding gate dielectric layer 216 is disposed over the vertically oriented drift regions 208. In the instant example, the gates 214 are disposed in trenches in the substrate 202 and do not abut adjacent instances of the deep trench structures 204. At least one p-type body region 218 is disposed in the substrate 202 adjacent to the gates 214 and the vertically oriented drift regions 208. At least one n-type source region 220 is disposed in the substrate adjacent to the gates 214. One or more optional p-type body contact regions 222 may be disposed in the substrate 202 abutting the body regions 218. Electrical connection to the source regions 220 and the body contact regions 222 in the instant example are made at a top surface of the substrate 202. It will be recognized that other configurations of gates may be used in the vertical drain extended MOS transistor 210 with the configuration of deep trench structures 204, vertical drain contact region 206 and vertically oriented drift region 208 depicted in FIG. 2.

Instances of the vertically oriented drift regions 208 are disposed adjacent to the vertical drain contact region 206. For example, instances of the vertically oriented drift regions 208 may alternate with the vertical drain contact region 206, as depicted in FIG. 2. The deep trench structures 204 may surround the vertically oriented drift regions 108, as depicted in FIG. 2. The vertical drain contact region 106 may be contiguous, as depicted in FIG. 2. Forming the vertical drain extended MOS transistor 210 so that the deep trench structures 204 provide RESURF regions for the vertically oriented drift regions 208 may provide a desired balance between operating voltage and specific resistivity for the vertical drain extended MOS transistor 210. Forming the vertical drain contact region 206 so as to extend laterally past the bottoms 212 of the deep trench structures 204 but not enough to isolate the vertically oriented drift region 208 from a bottom region of the substrate 202 may allow depletion of the vertically oriented drift region 208 along a greater vertical distance and thus desirably allow operation at a higher voltage.

Figure 3:
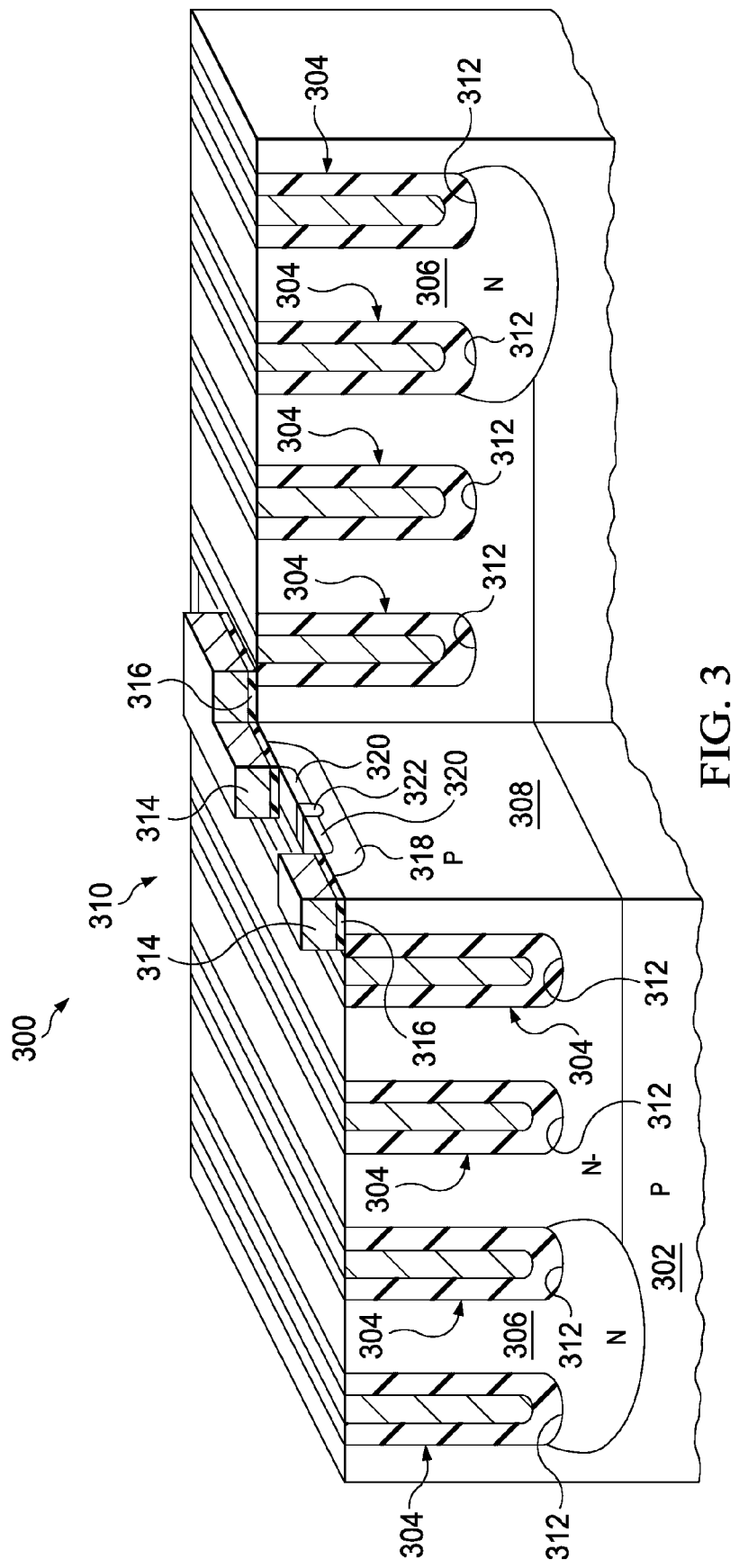
FIG. 3 is a cross section of a further semiconductor device having a vertical drain extended MOS transistor.

FIG. 3 is a cross section of a further semiconductor device having a vertical drain extended MOS transistor. The semiconductor device 300 is formed in and on a p-type semiconductor substrate 302. Deep trench structures 304, as described in reference to FIG. 1, are disposed in the substrate 302 so as to define at least one n-type vertical drain contact region 306 and at least one n-type vertically oriented drift region 308 of the vertical drain extended MOS transistor 310. The vertical drain contact region 306 is bounded on at least two opposite sides by the deep trench structures 304. The vertical drain contact region 306 is n-type and may extend below bottoms 312 of the deep trench structures 304 as depicted in FIG. 3. In the instant example, the vertically oriented drift region 308 is laterally displaced from the vertical drain contact region 306 by at least two instances of the deep trench structures 304, providing a horizontal drift component to an extended drain of the vertical drain extended MOS transistor 310. Electrical connection to the vertical drain contact region 306 in the instant example is made at a top surface of the substrate 302.

At least one gate 314 and corresponding gate dielectric layer 316 is disposed over the vertically oriented drift regions 308. In the instant example, the gates 314 are disposed above the substrate 302 over a p-type body region 318 and n-type source region 320. One or more optional p-type body contact regions 322 may be disposed in the substrate 302 abutting the body regions 318. Electrical connection to the source regions 320 and the body contact regions 322 in the instant example are made at a top surface of the substrate 302. It will be recognized that other configurations of gates may be used in the vertical drain extended MOS transistor 310 with the configuration of deep trench structures 304, vertical drain contact region 306 and laterally displaced vertically oriented drift region 308 depicted in FIG. 3. Forming the vertically oriented drift region 308 to be laterally displaced from the vertical drain contact region 306 may allow lateral depletion of the vertically oriented drift region 308 and thus advantageously increase an operating voltage of the vertical drain extended MOS transistor 310 without requiring deeper instances of the deep trench structures 304.

Figure 4:
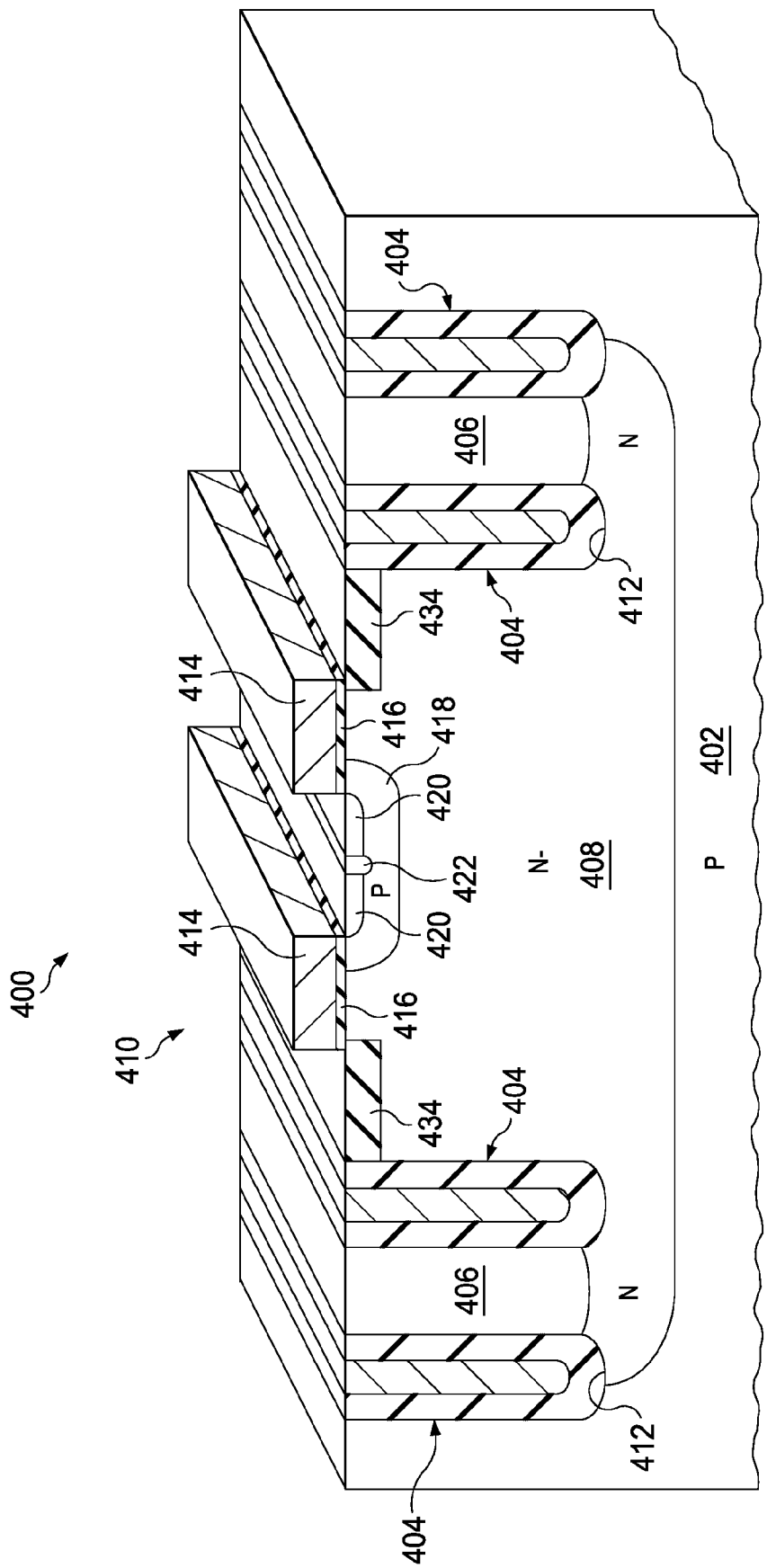
FIG. 4 is a cross section of another semiconductor device having a vertical drain extended MOS transistor.

FIG. 4 is a cross section of another semiconductor device having a vertical drain extended MOS transistor. The semiconductor device 400 is formed in and on a p-type semiconductor substrate 402. Deep trench structures 404 are disposed in the substrate 402 as described in reference to FIG. 1, so as to define at least one vertical drain contact region 406 and at least one vertically oriented drift region 408 of the vertical drain extended MOS transistor 410. The vertical drain contact region 406 is bounded on at least two opposite sides by the deep trench structures 404. The vertical drain contact region 406 is n-type and in the instant example extends proximate to, but not below, bottoms 412 of the deep trench structures 404. The vertically oriented drift regions 408 are n-type and make electrical connection to the vertical drain contact region 406 proximate to the bottoms 412 of the deep trench structures 404.

At least one gate 414 and corresponding gate dielectric layer 416 is disposed over the vertically oriented drift regions 408. In the instant example, the gates 414 are disposed above the substrate 402 over a p-type body region 418 and n-type source region 420. One or more optional p-type body contact regions 422 may be disposed in the substrate 402 abutting the body regions 418. In the instant example, portions of the vertically oriented drift regions 408 directly under the gates 414 are laterally separated from nearest instances of the deep trench structures 404 by dielectric material 434, such as field oxide 434. Such a configuration may add a horizontal drift component to the vertical drain extended MOS transistor 410 and thus advantageously increase an operating voltage of the vertical drain extended MOS transistor 410. The portion of the vertically oriented drift regions 408 directly under the gates 414 may also possibly be laterally separated from nearest instances of the vertical drain contact region 406 by at least two instances of the deep trench structures 404, as depicted in FIG. 3. It will be recognized that other configurations of gates may be used in the vertical drain extended MOS transistor 410 with the configuration of deep trench structures 404, vertical drain contact region 406 and vertically oriented drift region 408 depicted in FIG. 4. Forming the vertically oriented drift region 408 to be laterally displaced from the vertical drain contact region 406 may allow lateral depletion of the vertically oriented drift region 408 and thus advantageously increase an operating voltage of the vertical drain extended MOS transistor 410 without requiring deeper instances or additional instances of the deep trench structures 404.

Figure 5:
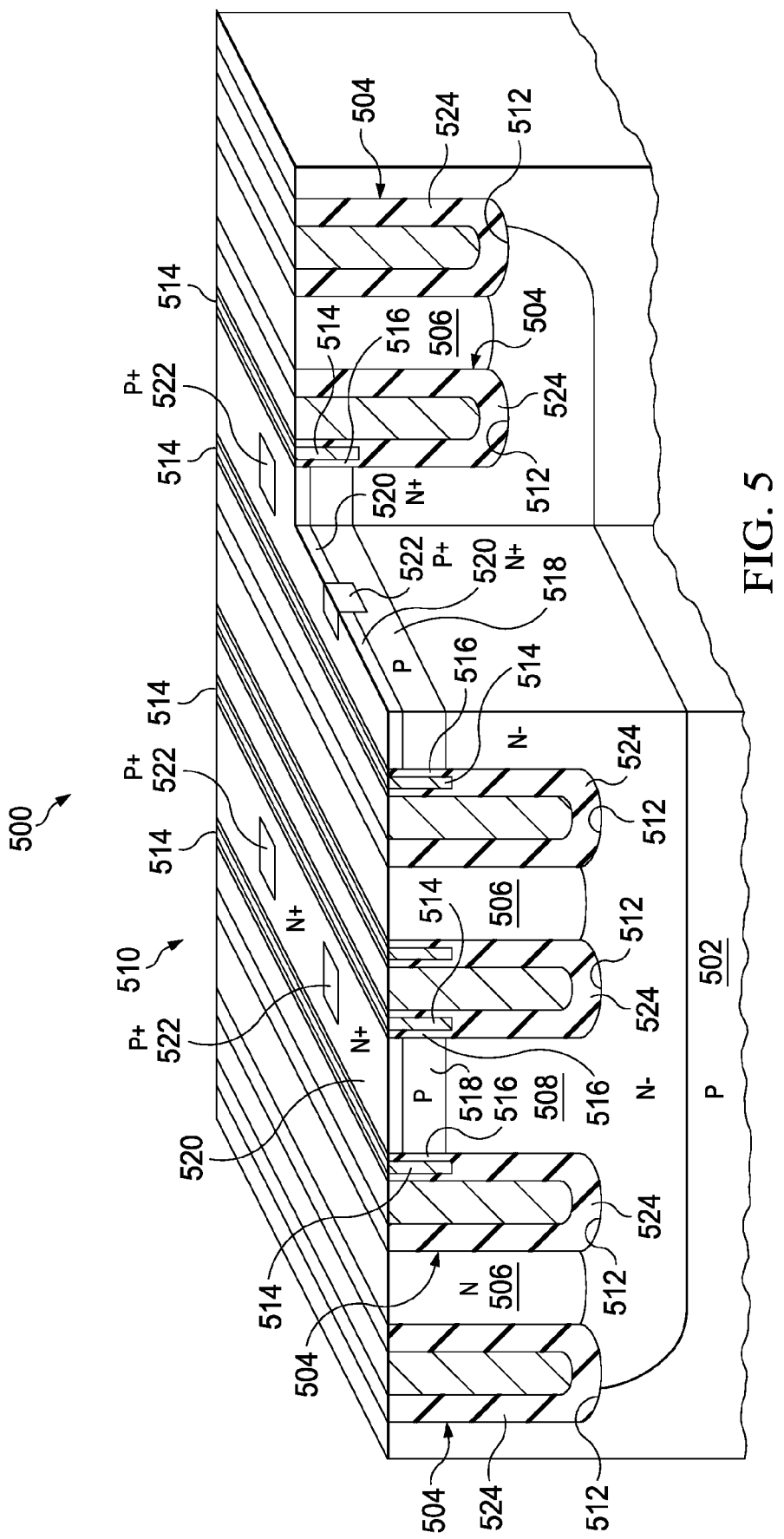
FIG. 5 is a cross section of a further semiconductor device having a vertical drain extended MOS transistor.

FIG. 5 is a cross section of a further semiconductor device having a vertical drain extended MOS transistor. The semiconductor device 500 is formed in and on a p-type semiconductor substrate 502 as described in reference to FIG. 1. Deep trench structures 504 are disposed in the substrate 502 as described in reference to FIG. 1 so as to define vertical portions of at least one vertical drain contact region 506 and at least one vertically oriented drift region 508 of the vertical drain extended MOS transistor 510. The vertical drain contact region 506 is bounded on at least two opposite sides by the deep trench structures 504. The vertical drain contact regions 506 are n-type and, in the instant example, extends proximate to, and possibly below, bottoms 512 of the deep trench structures 504. In the instant example, the vertically oriented drift region 508 extends below the bottoms 512 of the deep trench structures 504 and extends laterally so as to form a continuous n-type region. The vertically oriented drift region 508 is n-type and makes electrical connection to the vertical drain contact regions 506. Such a configuration may advantageously reduce an on-state resistance of the vertical drain extended MOS transistor 510.

At least one gate 514 and corresponding gate dielectric layer 516 is disposed above the vertically oriented drift regions 508. In the instant example, the gates 514 are disposed in the dielectric liners 524 of the deep trench structures 504, adjacent to a p-type body region 518 and n-type source region 520. One or more optional p-type body contact regions 522 may be disposed in the substrate 502 abutting the body regions 518. It will be recognized that other configurations of gates may be used in the vertical drain extended MOS transistor 510 with the configuration of deep trench structures 504, vertical drain contact region 506 and vertically oriented drift region 508 depicted in FIG. 5.

FIG. 6A through FIG. 6E are cross sections of a semiconductor device depicted in successive stages of fabrication.

Figure 6A:
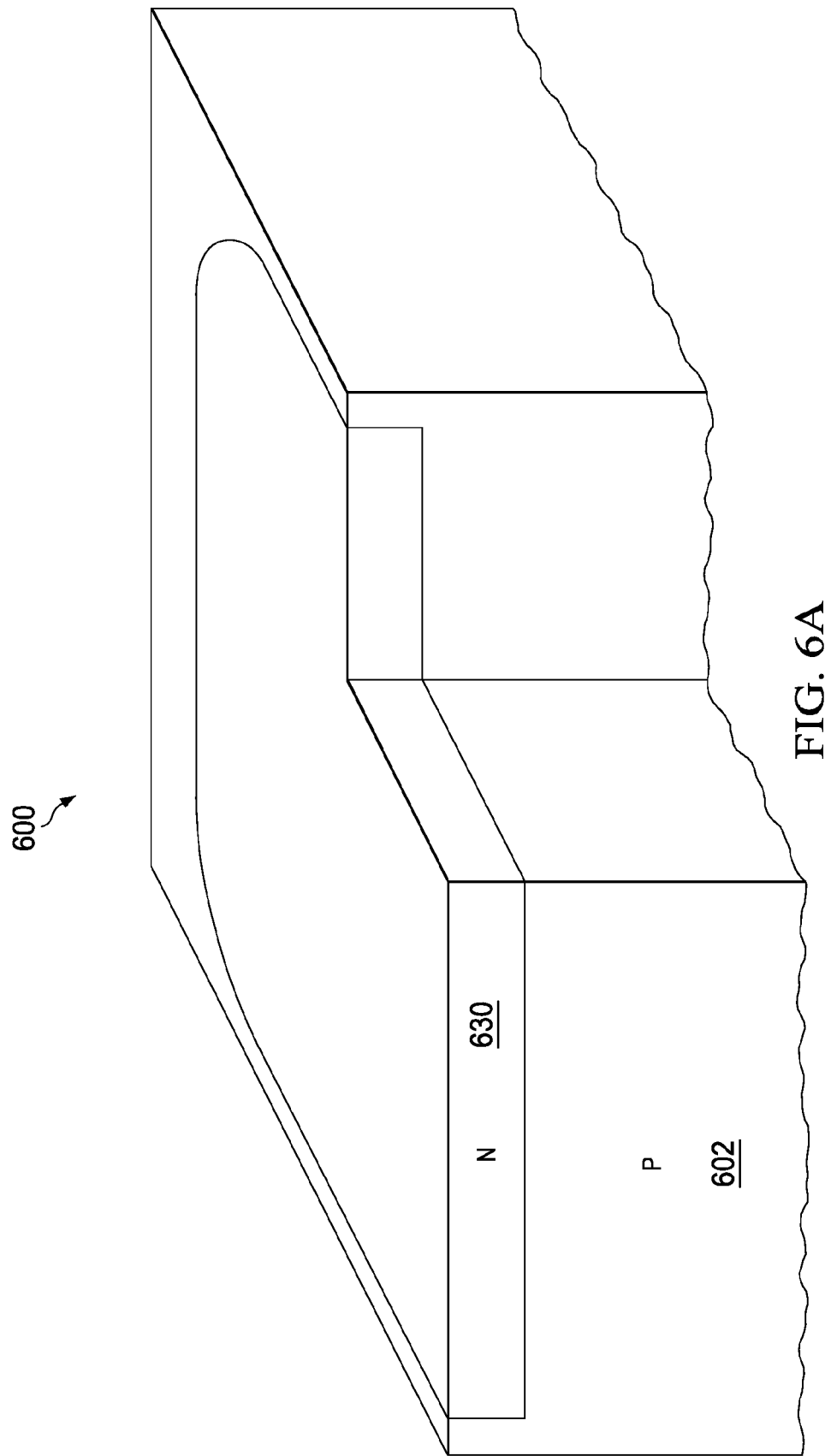
FIG. 6A through FIG. 6E are cross sections of a semiconductor device depicted in successive stages of fabrication.

Referring to FIG. 6A, the semiconductor device 600 is formed in and on a p-type semiconductor substrate 602 which may be, for example, a single crystal silicon wafer. A drift region ion implant process is performed which implants n-type dopants such as phosphorus into the substrate 602 in an area defined for vertically oriented drift regions, to form a drift implanted region 630. A dose of the drift region ion implant process may be, for example, $1 \times 10^{12}$ cm$^{-2}$ to $1 \times 10^{13}$ cm$^{-2}$. In one version of the instant embodiment, the drift implanted region 630 may extend over areas defined for vertical drain contact region, as depicted in FIG. 6A. In an alternate version, the drift implanted region 630 may be confined to an area of the substrate defined for the vertically oriented drift regions.

Figure 6B:
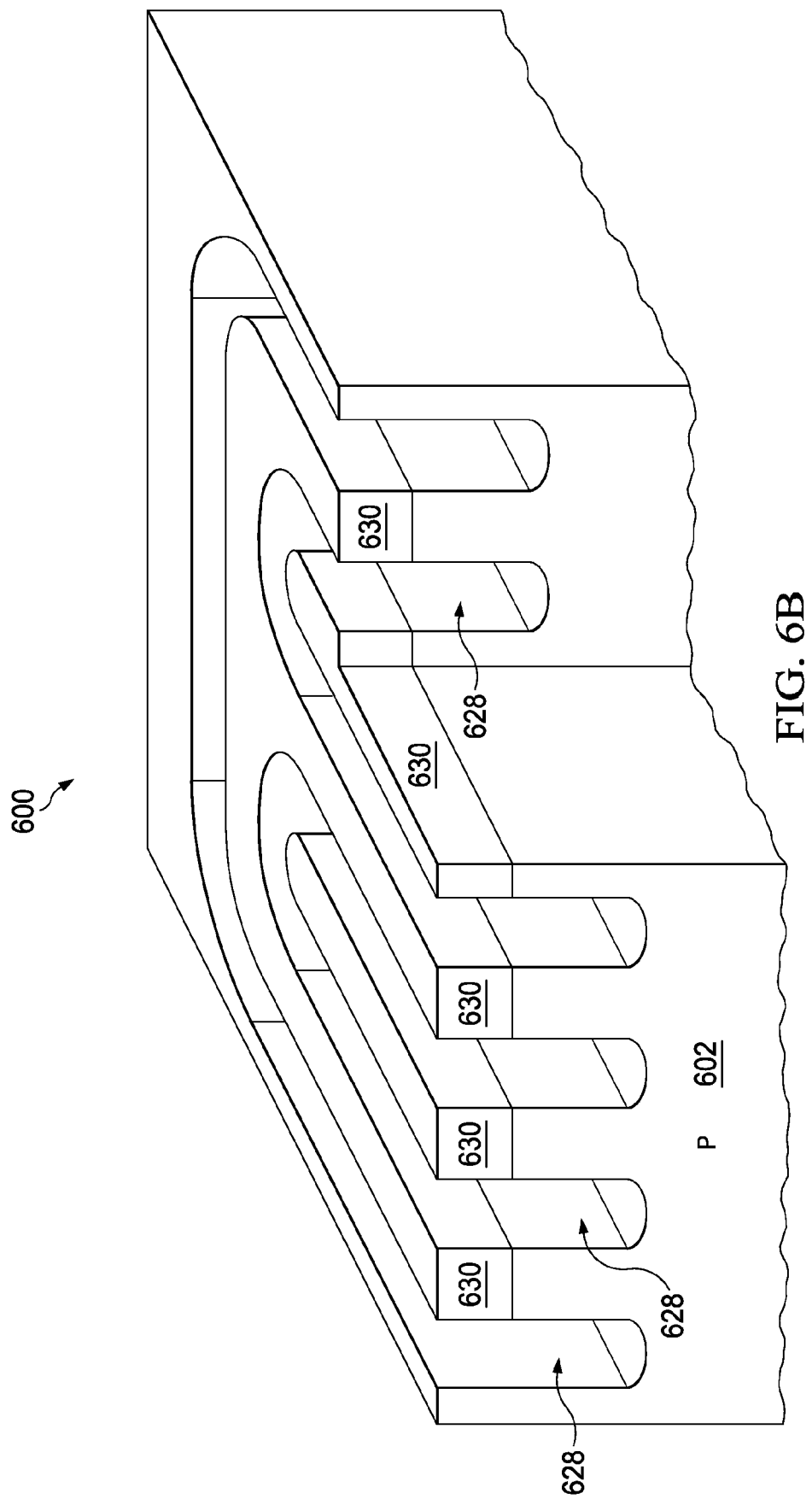

Referring to FIG. 6B, deep isolation trenches 628 are formed in the substrate 602, for example by a process stating with forming a layer of hard mask material over a top surface of the substrate 602. A hard mask may be formed by forming an etch mask by a photolithographic followed by removing the hard mask material over regions defined for the deep isolation trenches 628 using a reactive ion etch (RIE) process. After patterning the hard mask, material is removed from the substrate 602 in the deep isolation trenches 628 using an anisotropic etch process, such as a Bosch deep RIE process or a continuous deep RIE process.

Figure 6C:
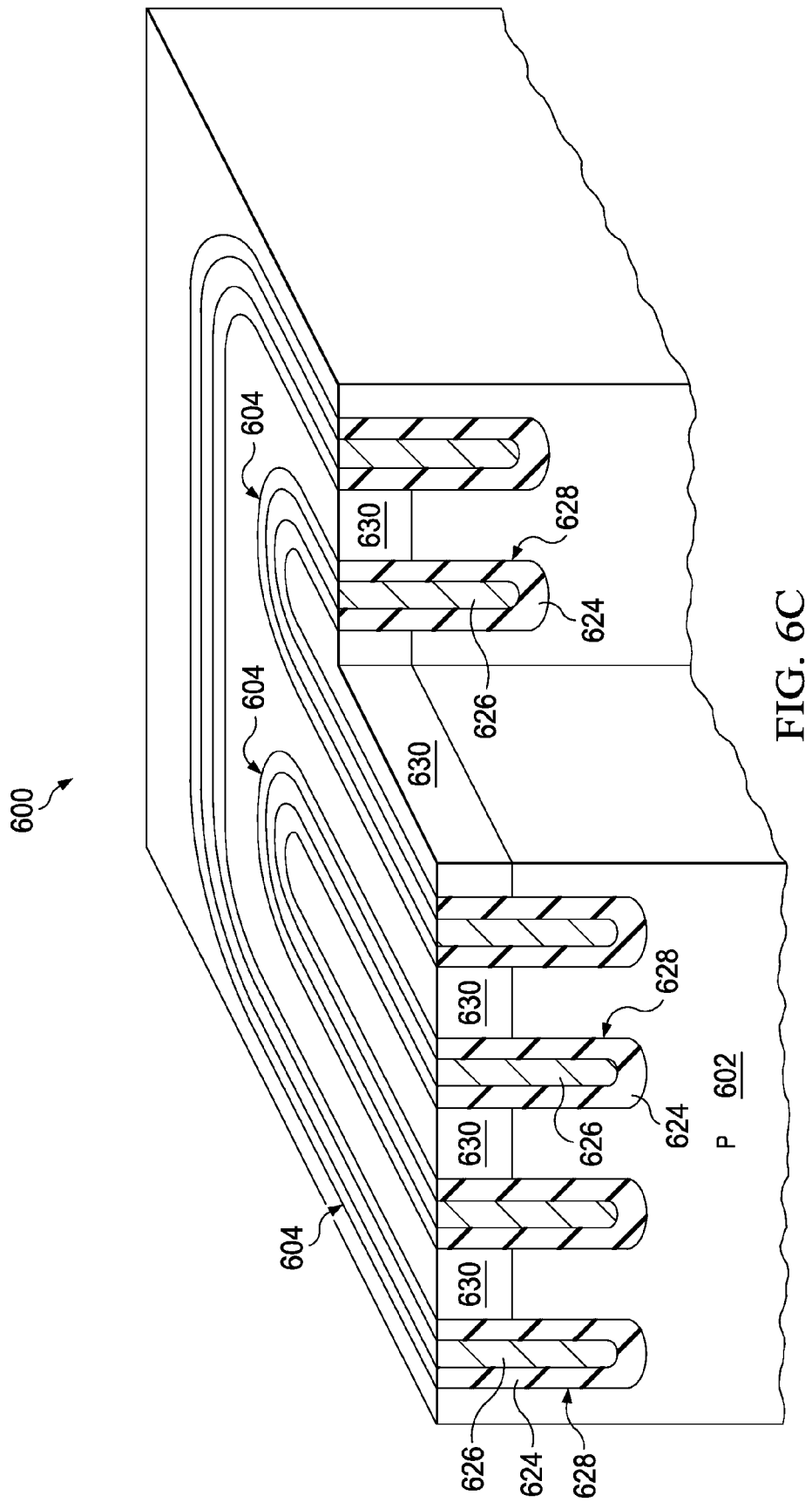

Referring to FIG. 6C, dielectric liners 624 are formed in the deep isolation trenches 628, so that the dielectric liners 624 abut the substrate 602. The dielectric liners 624 may include, for example, thermally grown silicon dioxide. The dielectric liners 624 may also include one or more layers of dielectric material such as silicon dioxide, silicon nitride and/or silicon oxynitride, formed by a chemical vapor deposition (CVD) process.

Optional electrically conductive central members 626 may be formed on the dielectric liners 624. The electrically conductive central members 626 may include, for example, polycrystalline silicon, commonly referred to as polysilicon, formed by thermally decomposing SiH$_4$ gas inside a low-pressure reactor at a temperature of 580° C. to 650° C. The polysilicon may be doped during formation to provide a desired electrical conductivity. The deep isolation trenches 628 filled with the dielectric liners 624 and the electrically conductive central members 626, if present, form deep trench structures 604. Unwanted dielectric material over the top surface of the substrate 602 from formation of the dielectric liners 624 and unwanted conductive material over the top surface of the substrate 602 from formation of the electrically conductive central members 626 may be removed, for example using an etchback and/or chemical mechanical polish (CMP) process.

Figure 6D:
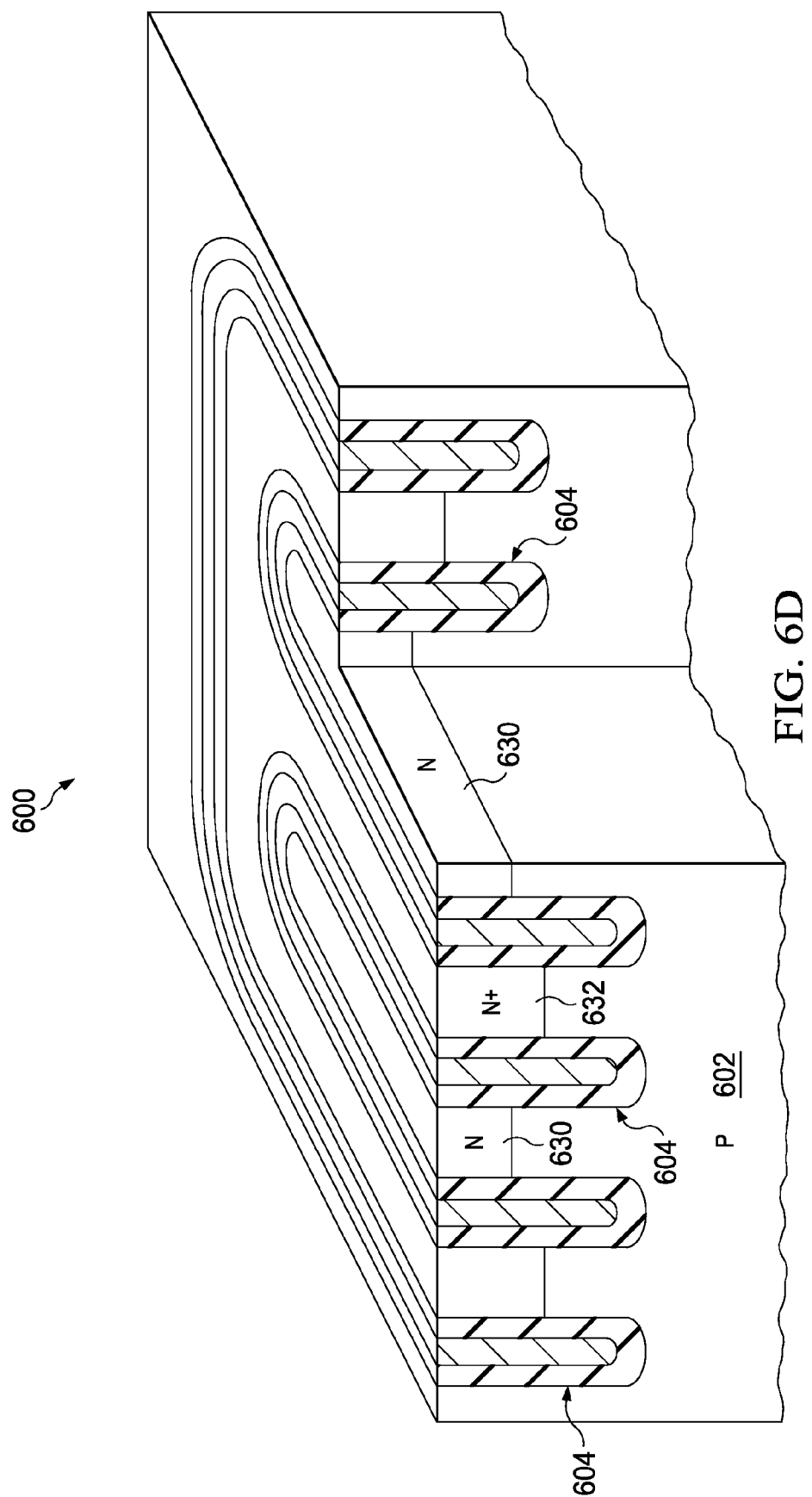

Referring to FIG. 6D, a drain contact ion implant process is performed which implants n-type dopants such as phosphorus into the substrate 602 in an area defined for the vertical drain contact region, to form a drain contact implanted region 632. A dose of the drift region ion implant process is at least ten times higher than the drift region ion implant dose, and may be, for example, $1 \times 10^{16}$ cm$^{-2}$ to $3 \times 10^{16}$ cm$^{-2}$. The drain contact ion implant process may possibly provide dopants to polysilicon versions of the electrically conductive central members 626, to attain a desired electrical conductivity.

Figure 6E:
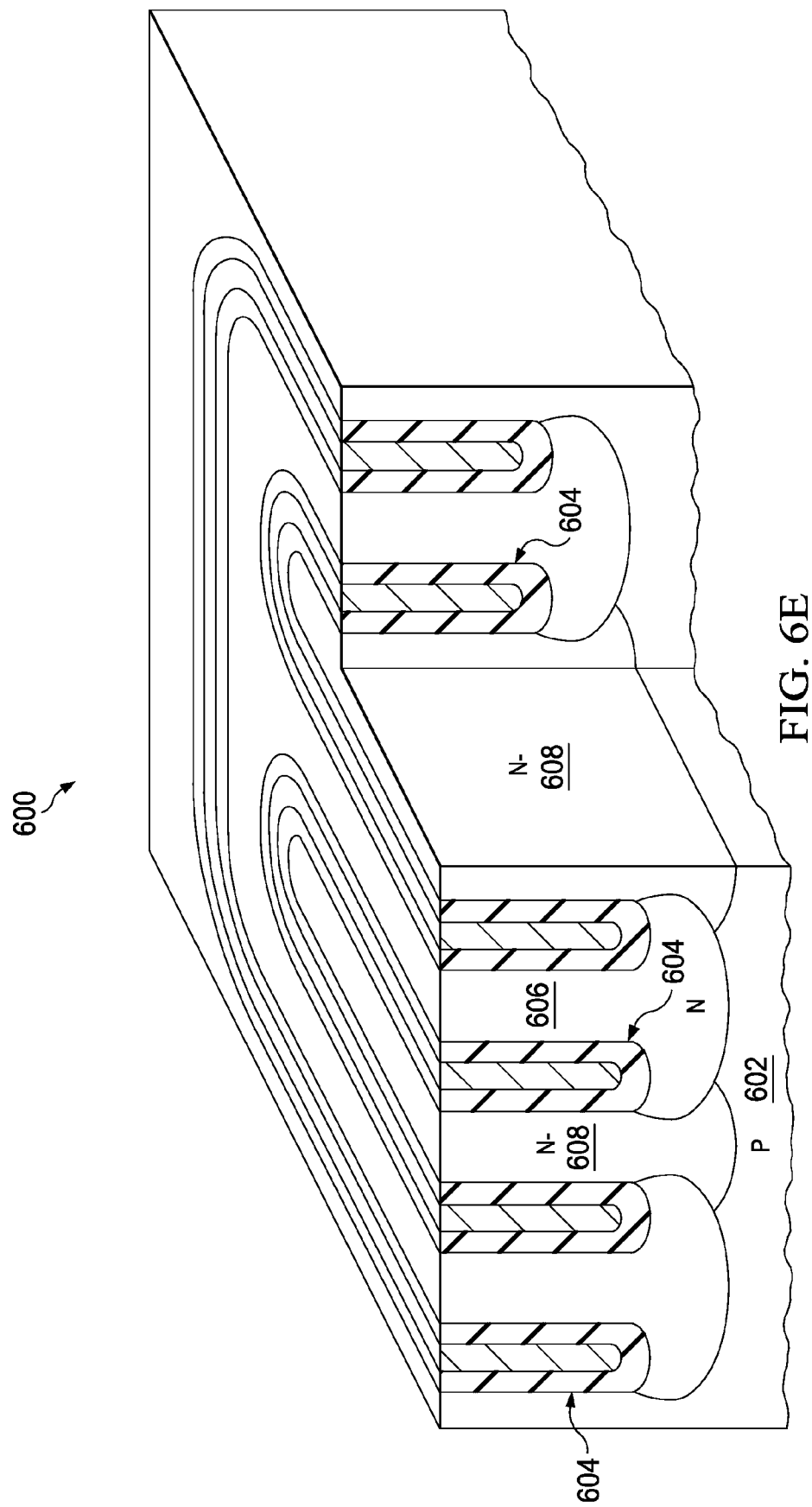

Referring to FIG. 6E, a thermal drive operation is performed which heats the substrate 602 so as to activate and diffuse the implanted dopants in the drift implanted regions 630 and the drain contact implanted region 632 and thereby form the vertically oriented drift regions 608 and the vertical drain contact region 606, respectively. Conditions of the thermal drive operation depend on a depth of the deep trench structures 604 and a desired lateral extent of the vertical drain contact region 606 at the bottoms of the deep trench structures 604. For example, a vertical drain extended MOS transistor with deep trench structures 604 that are 2.5 microns deep may have a thermal drive operation which heats the substrate 602 at 1100° C. for 3.5 to 4 hours, or equivalent anneal conditions, for example, 1125° C. for 2 hours, or 1050° C. for 12 hours.

Figure 7:
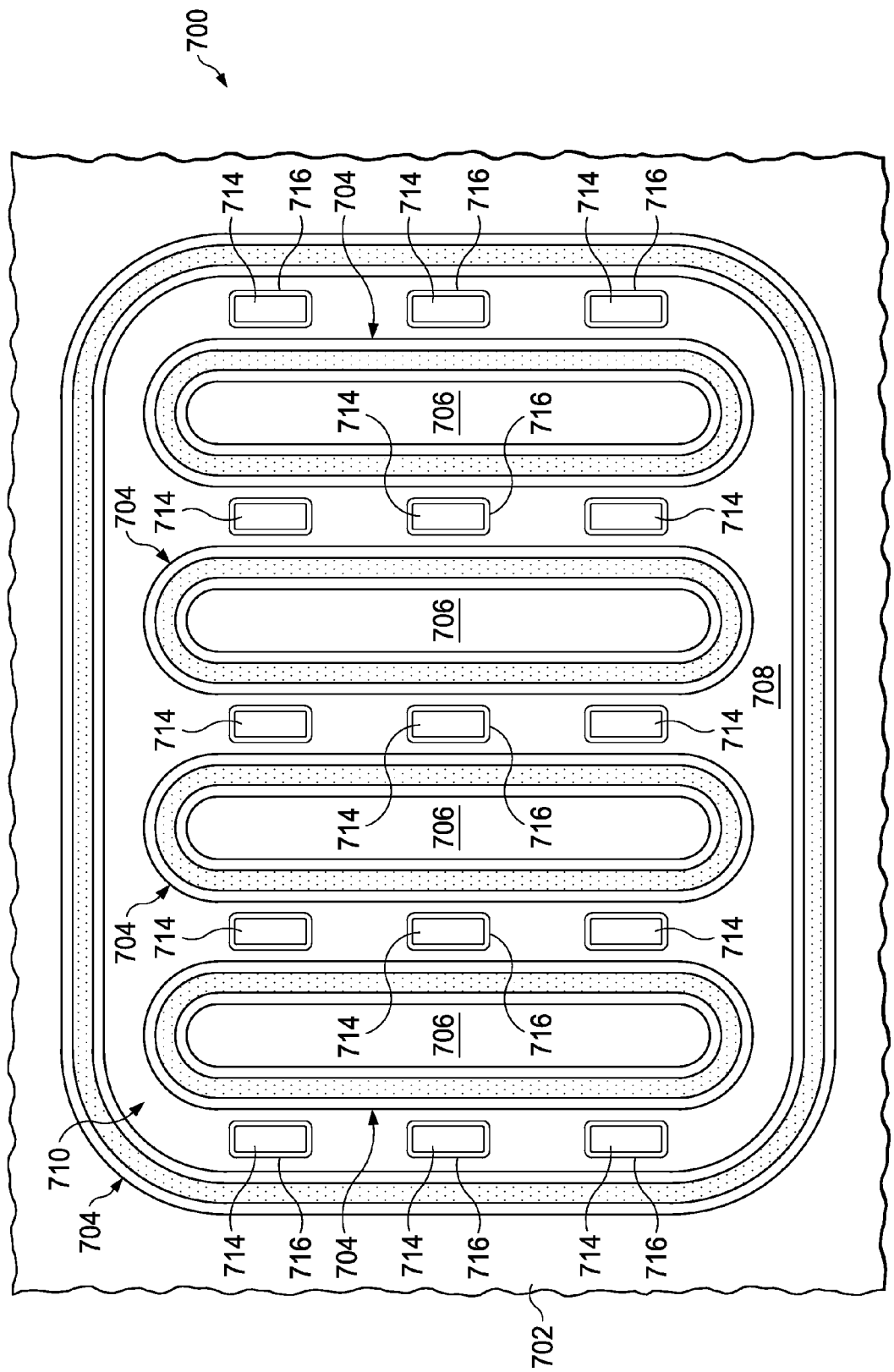
FIG. 7 and FIG. 8 are top views of semiconductor devices having vertical drain extended MOS transistors.
Figure 8:
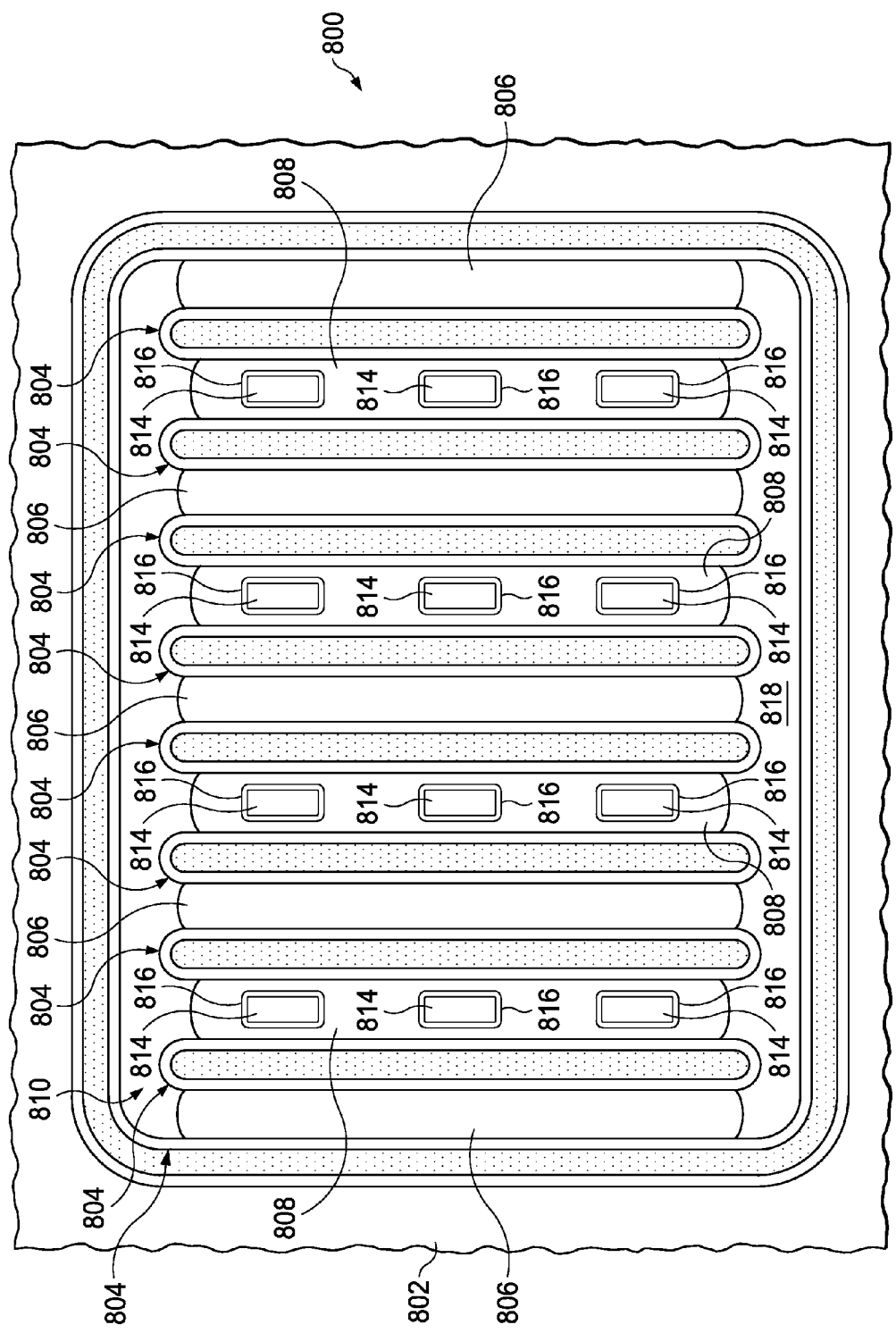

FIG. 7 and FIG. 8 are top views of semiconductor devices having vertical drain extended MOS transistors. Gates depicted in FIG. 7 and FIG. 8 are disposed in trenches as discussed in reference to FIG. 2, but it will be recognized that other configurations of gates may be used in the examples depicted. Referring to FIG. 7, the semiconductor device 700 is formed in and on a semiconductor substrate 702 as described in reference to FIG. 6A. A plurality of deep trench structures 704 with closed loop configurations is disposed in the substrate 702. Instances of the deep trench structures 704 laterally surround vertical drain contact regions 706. Gates 714 and gate dielectric layer 716 of the vertical drain extended MOS transistor 710 are disposed between the deep trench structures 704 laterally surrounding the vertical drain contact regions 706. A vertical drift region 708 is disposed between the deep trench structures 704 surrounding the vertical drain contact regions 706. A body region, source regions and body contact regions of the vertical drain extended MOS transistor 710 are not shown in FIG. 7 to more clearly show the arrangement of the vertical drift region 708 and the vertical drain contact regions 706. An instance of the deep trench structures 704 laterally surrounds the vertical drain extended MOS transistor 710. Electrical connection to the vertical drain contact regions 706 are made at a top surface of the substrate 702. Surrounding the vertical drain contact regions 706 with the deep trench structures 704 may prevent a breakdown electric field between a drain contact and a body region of the vertical drain extended MOS transistor 710 and thus may advantageously allow the vertical drain extended MOS transistor 710 to operate at a higher voltage than otherwise.

Referring to FIG. 8, the semiconductor device 800 is formed in and on a semiconductor substrate 802 as described in reference to FIG. 6A. A plurality of deep trench structures 804 with linear configurations is disposed in the substrate 802. Vertical drain contact regions 806 are disposed between adjacent pairs of the linear deep trench structures 804. Gates 814 and gate dielectric layers 816 are disposed between adjacent pairs of the deep trench structures 804 alternating with the vertical drain contact regions 806. Vertical drift regions 808 are disposed between the alternate pairs of deep trench structures 804 with the gates 814. A body region 818 is disposed around the linear deep trench structures 804 and extends over the vertical drift regions 808 so as to abut the gates 814; the portion of the body region 818 extending over the vertical drift regions 808 and the source regions and body contact regions of the vertical drain extended MOS transistor 810 are not shown in FIG. 8 to more clearly show the arrangement of the vertical drift region 808 and the vertical drain contact regions 806. An instance of the deep trench structures 804 laterally surrounds the vertical drain extended MOS transistor 810. Electrical connection to the vertical drain contact regions 806 are made at a top surface of the substrate 802. Disposing the vertical drain contact regions 806 between linear deep trench structures 804 may advantageously reduce an area required for the vertical drain extended MOS transistor 810, thereby reducing a fabrication cost of the semiconductor device 800.

While various embodiments of the present invention have been described above, it should be understood that they have been presented by way of example only and not limitation.

Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
a substrate comprising a semiconductor having a first conductivity type; and
a vertical drain extended metal oxide semiconductor (MOS) transistor, including:
a deep trench structure disposed in said substrate, at least one micron deep, having a dielectric liner abutting said substrate;
a vertical drain contact region having a second conductivity type opposite from said first conductivity type disposed in said substrate, said vertical drain contact region abutting and being bounded on at least two opposite sides by said deep trench structure, said vertical drain contact region extending below a bottom of said deep trench structure;
a vertically oriented drift region having said second conductivity type, disposed in said substrate, laterally separated from said vertical drain contact region by a portion of said deep trench structure, said vertically oriented drift region making electrical contact to said vertical drain contact region proximate to said bottom of said deep trench structure; and
a body region having said first conductivity type disposed over said vertically oriented drift region.

2. The semiconductor device of claim 1, in which said vertical drain contact region does not extend laterally past said deep trench structure abutting said vertical drain contact region.

3. The semiconductor device of claim 1, in which said vertical drain contact region extends laterally past said deep trench structure abutting said vertical drain contact region.

4. The semiconductor device of claim 1, in which said vertical drain contact region extends laterally under said vertically oriented drift region and abuts an adjacent portion of said vertical drain contact region.

5. The semiconductor device of claim 1, in which said vertical drain contact region is laterally surrounded by said deep trench structure, said deep trench structure having a closed loop configuration.

6. The semiconductor device of claim 1, in which said vertically oriented drift region is laterally surrounded by said deep trench structure, said deep trench structure having a closed loop configuration.

7. The semiconductor device of claim 1, in which said body region abuts said portion of said deep trench structure which abuts said vertical drain contact region opposite from said body region.

8. The semiconductor device of claim 1, in which said body region is laterally separated by dielectric material from said portion of said deep trench structure which abuts said vertical drain contact region opposite from said body region.

9. The semiconductor device of claim 1, in which said deep trench structure is 2.5 microns to 5 microns deep.

10. The semiconductor device of claim 1, in which:
said first conductivity type is p-type; and
said second conductivity type is n-type.

11. A semiconductor device, comprising:
a substrate comprising a semiconductor having a first conductivity type; and
a vertical drain extended metal oxide semiconductor (MOS) transistor, including:
a deep isolation trench structure disposed in said substrate, at least one micron deep, having a dielectric liner abutting said substrate;
a vertical drain contact region having a second conductivity type opposite from said first conductivity type disposed in said substrate, said vertical drain contact region abutting and being bounded on at least two opposite sides by said deep isolation trench structure, said vertical drain contact region extending from a surface of the substrate and along an edge of the deep isolation trench structure to below a bottom of said deep isolation trench structure;
a vertically oriented drift region having said second conductivity type and a dopant concentration less than the vertical drain contact region, disposed in said substrate, laterally separated from said vertical drain contact region by a portion of said deep isolation trench structure including the dielectric liner, said vertically oriented drift region making electrical contact to said vertical drain contact region proximate to said bottom of said deep isolation trench structure; and
a body region having said first conductivity type disposed over said vertically oriented drift region.

* * * * *